US008841559B2

(12) United States Patent
Chiba et al.

(10) Patent No.: US 8,841,559 B2
(45) Date of Patent: Sep. 23, 2014

(54) COPPER COLUMN

(75) Inventors: Yutaka Chiba, Iwate (JP); Shinichi Nomoto, Saitama (JP); Koji Watanabe, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 278 days.

(21) Appl. No.: 13/579,384

(22) PCT Filed: Feb. 22, 2011

(86) PCT No.: PCT/JP2011/054430
§ 371 (c)(1),
(2), (4) Date: Aug. 23, 2012

(87) PCT Pub. No.: WO2011/105598
PCT Pub. Date: Sep. 1, 2011

(65) Prior Publication Data
US 2013/0025917 A1 Jan. 31, 2013

(30) Foreign Application Priority Data
Feb. 24, 2010 (JP) .................................. 2010-039096

(51) Int. Cl.
H05K 1/09 (2006.01)
(52) U.S. Cl.
USPC ........... 174/257; 174/255; 174/529; 174/537; 361/718; 257/692; 257/697; 257/701; 428/210; 428/42; 428/432
(58) Field of Classification Search
USPC .................. 174/257, 255, 529, 537; 361/718; 257/692, 697, 701; 428/210, 428, 432
See application file for complete search history.

(56) References Cited

U.S. PATENT DOCUMENTS 4,677,526 A * 6/1987 Muehling ...................... 361/718
4,740,414 A * 4/1988 Shaheen ....................... 428/210
(Continued)

FOREIGN PATENT DOCUMENTS

JP 02-275660 11/1990
JP 08-241950 9/1996
(Continued)

OTHER PUBLICATIONS

International Search Report for PCT/JP2011/054430, Japanese Patent Office, Mar. 9, 2011, 1 page.
(Continued)

Primary Examiner — Xiaoliang Chen
(74) Attorney, Agent, or Firm — Chernoff, Vilhauer, McClung & Stenzel LLP

(57) ABSTRACT

To prevent the breakage of the joint between a ceramic substrate and a glass epoxy substrate. The copper column is formed by a wiredrawing step for drawing a copper wire formed linearly to a predetermined diameter; a cutting step for cutting the copper wire, which has been drawn in the wire drawing step, in a predetermined length; a pressing step for pressing one end of the copper wire, which has been cut in the cutting step, in a longitudinal direction to form a copper column member; and an annealing step for annealing the copper column member, which has been formed in the pressing step, by maintaining a heating period of 60 minutes or longer at 600° C. or higher. Thereby, the Vickers hardness of the copper column becomes is 55 HV or less and the copper column is softened. Therefore, when joining the ceramic substrate and the glass epoxy substrate through the copper column, heat stress caused by a difference between the thermal expansion of the ceramic substrate and the thermal expansion of the glass epoxy substrate can be absorbed by the copper member. As a result, the breakage of the joint between the ceramic substrate and the glass epoxy substrate can be prevented.

4 Claims, 7 Drawing Sheets

(56) References Cited

U.S. PATENT DOCUMENTS

| | | | |
|---|---|---|---|
| 5,752,182 A * | 5/1998 | Nakatsuka et al. | 455/333 |
| 2002/0004324 A1* | 1/2002 | Saiki et al. | 439/83 |
| 2006/0186179 A1* | 8/2006 | Levine et al. | 228/180.5 |
| 2008/0117509 A1* | 5/2008 | Hayashi et al. | 359/486 |
| 2010/0065959 A1* | 3/2010 | Horiuchi et al. | 257/692 |
| 2010/0253463 A1* | 10/2010 | Shimomura et al. | 336/200 |
| 2012/0305297 A1* | 12/2012 | Nomoto et al. | 174/255 |

FOREIGN PATENT DOCUMENTS

| | | |
|---|---|---|
| JP | 2000030558 | 1/2000 |
| JP | 2002-009433 | 1/2002 |
| JP | 2002289729 | 10/2002 |
| JP | 2002289761 | 10/2002 |
| JP | 2003249598 | 9/2003 |
| TW | 503546 | 9/2002 |

OTHER PUBLICATIONS

Japanese Office Action (with English translation) issued for Japanese Patent Application No. 2010-039096, mailed Jan. 7, 2014, 5 pages.

* cited by examiner

COPPER COLUMN

TECHNICAL FIELD

The present invention relates to a copper column for joining a ceramic substrate and a glass epoxy substrate and to a method for manufacturing thereof.

BACKGROUND

Nowadays, along with communication speed-up of communication equipment and density growth of integrated circuits, there is a trend toward the increasing number of lead wires for electronics parts used for them. For example, there are conventional electronics parts having a lot of lead wires, such as QFP (Quad Flat Package), SOIC (Small Outline Integrated Circuit), etc.; however, in recent electronics parts having further multiple functions, such QFP and SOIC, etc. more number of lead wires is needed. Then, BGA (Ball Grid Array) becomes to be used as an electronics part having increased number of lead wires. There are many kinds of BGAs, such as PBGA (Plastic Ball Grid Array), TBGA (Tape Ball Grid Array), CBGA (Ceramic Ball Grid Array) etc. Especially, the CBGA is apt to be used for super computers and the like and it requires high reliability.

The CBGA is composed of a ceramic substrate and a printed circuit board (for example, glass epoxy substrate, etc.) and generates heat when a voltage is applied. In accordance with this heat generation, the ceramic substrate and the glass epoxy substrate are expanded. When the voltage applied to the CBGA is removed, the ceramic substrate and glass epoxy substrate are shrunken. As described hereinbefore, the ceramic substrate and glass epoxy substrate are repeatedly expanded and shrunken by applying the voltage to the CBGA and removing the voltage from it.

In general, a coefficient of thermal expansion for the ceramic substrate is 8 ppm/° C. and the coefficient of thermal expansion of the glass epoxy substrate is 15-20 ppm/° C. Therefore, a thermal expansion difference between the ceramic substrate and the glass epoxy substrate causes heat stress in the ceramic substrate and the glass epoxy substrate. Recently, a ceramic column grid array (hereinafter referred to as "CGA") is used instead of the CBGA wherein the CGA is composed of a column having a better ability of absorbing the heat stress than that of a solder ball.

A general method for forming the CGA and mounting the CGA on the glass epoxy substrate will be discussed. First, solder paste is applied to an electrode portion of the ceramic substrate, which is not shown in a drawing. Then, a mounting jig is positioned on the ceramic substrate for mounting a column at a right angle with the electrode portion. The column is inserted into a through-hole made at the mounting jig so that the column stands within the solder paste on the electrode. They are put in a heating furnace, such as a reflow furnace, while keeping their relationship, and they are heated under predetermined temperature condition. Then, the solder paste applied to the electrode portion of the ceramic substrate is melted and the ceramic substrate is soldered with the column to form the CGA.

For mounting the CGA on the glass epoxy substrate, the solder paste is applied to the electrode portion of the glass epoxy substrate. Then, the column of the CGA is mounted on the electrode portion and is heated by the reflow furnace. The solder paste is melted, and the column and the glass epoxy substrate are soldered to each other to mount the CGA on the glass epoxy substrate. As described hereinbefore, before the CGA is mounted to the glass epoxy substrate, they are heated twice by the reflow furnace.

A high-temperature solder is frequently used for the CGA column in order to prevent the column from being melted in two heating steps by the reflow furnace or to prevent the column from being melted by heat that is generated by an IC chip mounted on a super computer and the like.

Further, since the column connects the ceramic substrate to the glass epoxy substrate, if the column is hard, the above-described heat stress may cause crack and fracture at joints between the ceramic substrate and the column, joints between the glass epoxy substrate and the column and the column itself. Therefore, soft material is used as the high-temperature solder for the column in order to absorb the heat stress, and such material are, for example, Pb based Pb—Sn solder, such as 95Pb-5Sn, 89.5PB-10.5Sn having low Vickers hardness.

With consideration for environment concern, the column excluding Pb, namely, lead-free type column is required. Intermetallic compound, such as $Cu_3Sn$, $Cu_6Sn_5$, formed by reaction of Cu (copper), Sn (tin) and Bi—Sn solder containing Bi (bismuth) as a main ingredient and the like are known as a replacement of the Pb—Sn solder.

However, since the intermetallic compound, such as $Cu_3Sn$, $Cu_6Sn_5$, etc., and Bi—Sn solder and the like are hard and brittle, when they are used as the column for joining the ceramic substrate and the glass epoxy substrate similarly to the CGA, the heat stress cannot be absorbed. In addition, as described hereinbefore, the crack and fracture facilitate at the joint between the ceramic substrate and the column, the joint between the glass epoxy substrate and the column and the column itself.

A copper column using Cu (copper) of good electrical and heat conductivity is known as the column material except for the solder. Patent Document 1 discloses an electrical pin in which Cu is plated for antioxidation but it is not used for the CGA. In this electrical pin, a plurality of pin members in which copper wires are plated with Sn or Fe are held in hardening resin, wherein one ends of the held pin members are plated with Cu and the other ends are mounted on the ceramic substrate. By etching the hardening resin or the Sn or Fe plating, the pin members stand on and are connected to the ceramic substrate.

Patent Document 2 discloses a pin that removes the residual stress by heating Cu but it is not used for the CGA. In this pin, one end of a copper wire is pressed to form a head portion and the copper wire having the formed head portion is heated at 600° C.-900° C. for five minutes. This heating step removes the residual stress due to the processing strain produced by the press work.

DOCUMENTS FOR PRIOR ART

Patent Documents

Patent Document 1: Japanese Patent Application Publication No. H02-275660
Patent Document 2: Japanese Patent Application Publication No. 2002-289729

SUMMARY OF THE INVENTION

Problems to be Solved by the Invention

In a comparison between Pb—Sn solder and Cu, however, Cu is much harder than Pb—Sn because the Vickers hardness of the Cu is 110-120 HV and the Vickers hardness of the Pb—Sn solder is 3 HV. Therefore, a conventional copper column cannot absorb the heat stress generated at the ceramic substrate and the glass epoxy substrate, and a problem is that cracks occur at the joint between the ceramic substrate and the column and the joint between the glass epoxy substrate and the column.

As described hereinbefore, the electrical pin discussed in Patent Document 1 uses Cu having 110-120 HV of the Vickers hardness and the end surface of the electrical pin is plated with Cu so that it is further harder and it cannot be applied to the CGA.

The pin discussed in Patent Document 2 removes the residual stress by using the heat treatment wherein the residual stress is based on the processing strain generated by the pressing step; however, the pin is not softened to be applied to the CGA.

Thus, the present invention solves the problems of the prior embodiments and its object is to provide a copper column that can prevent a joint between a ceramic substrate and a glass epoxy substrate from being damaged and can be applied to a CGA and a method for manufacturing thereof.

Means for Solving the Problems

The inventors have found that the Vickers hardness of a copper wire becomes 55 HV or less and there is less clack at a joint between a ceramic substrate and a copper column and a joint between a glass epoxy substrate and the copper column if the copper wire is annealed at a predetermined temperature for a predetermined period after it is work-hardened by a wiredrawing step, a cutting step, a pressing step, etc. Then, they has completed the present invention.

For solving the above-described problems, a copper column is characterized in that the copper column forms a ceramic column grid array and joins a ceramic substrate and a glass epoxy substrate, the copper column being made by a wiredrawing step for drawing a copper wire to a predetermined diameter, a cutting step for cutting the copper wire, which has been drawn in the wiredrawing step, into a predetermined length, and an annealing step for annealing the copper wire, which has been cut in the cutting step, as a copper column body section by maintaining the copper wire at 600° C. or higher in a heating temperature for a period of 60 minutes or longer, the copper column having the Vickers hardness of 55 HV or less and the copper column body section having a column head section with a flat end surface at one end thereof.

In the copper column, the copper structure of the copper wire is plastically deformed in the wiredrawing step and the cutting step so that the copper wire is work-harden. However, the work-hardened copper wire has better flexibility because the copper structure of the copper wire is recrystallized in the annealing step and crystal grains are grown up. Thus, the Vickers hardness of the copper column becomes 55 HV or less and the copper column can be softened.

Further since the Vickers hardness of the copper column is 55 HV or less, it can absorb the heat stress caused by a difference between a thermal expansion of the ceramic substrate and the thermal expansion of the glass epoxy substrate when joining the ceramic substrate and the glass epoxy substrate through the cooper column.

The column head section may have a diameter that is lamer than a diameter of the copper column body section.

The soldering strength of the ceramic substrate may be increased by providing the column head section with a flat end surface.

The copper wire annealed in the annealing step may be surface-treated with a surface treatment agent of amine series.

In the event that the copper wire or the copper column member is surface-treated with a surface treatment agent of amine series, the surface of the copper wire or the copper column member may become coarse so that plating solution can facilitate the adhesion thereto.

The annealed copper wire or the surface-treated copper wire may be plated with plating solution of methanesulfonic acid series.

In the event that the copper wire or the copper column member is plated with the plating solution of methanesulfonic acid series, the copper column can be rustproofed.

Effects of the Invention

According to the copper column of the present invention, because the heat stress caused by the difference between the thermal expansion of the ceramic substrate and the thermal expansion of the glass epoxy substrate is absorbed, the joint between the ceramic substrate and the glass epoxy substrate can be prevented from the destruction.

EMBODIMENT FOR IMPLEMENTING THE INVENTION

Figure 1A:
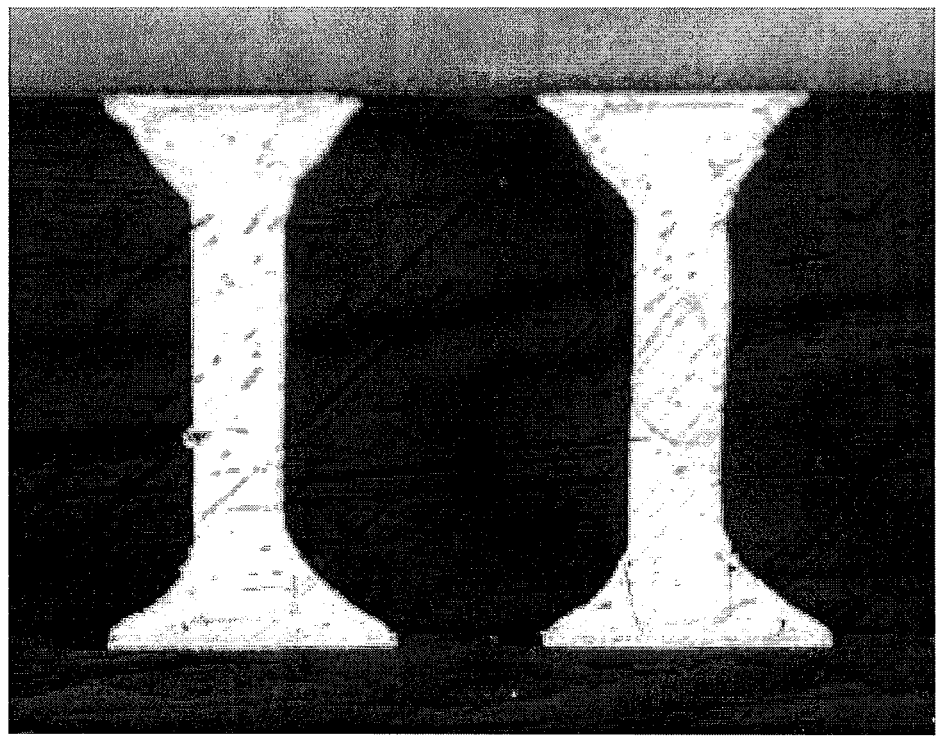
FIG. 1A is a photograph of a cross section of a copper column according to an embodiment of the subject invention for showing a usage example thereof.
Figure 1B:
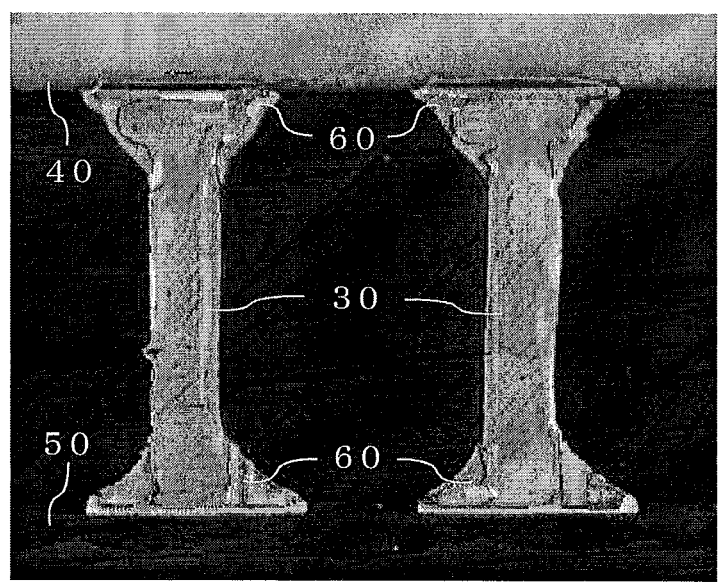
FIG. 1B is a drawing wherein reference numbers are attached to the copper column shown in the photograph of FIG. 1A.

As shown in FIGS. 1A and 1B, a copper column 30 according to the present invention joins a ceramic substrate 40 and a glass epoxy substrate 50 through solder fillets 60. The copper column 30 is a linearly-shaped copper wire that is formed by a wiredrawing step for drawing a copper wire made of an oxygen-free copper to a predetermined diameter; a cutting step for cutting the copper wire, which has been drawn in the wiredrawing step, into a predetermined length; a pressing step for pressing one end of the copper wire, which has been cut in the cutting step, in the longitudinal direction thereof to form a copper column member; an annealing step for annealing the copper column member, which has been formed in the pressing step, by maintaining the copper column member at 600° C. or higher in a heating temperature for a period of 60 minutes or longer; a surface treatment step for treating the surface of the copper column member, which has been annealed in the annealing step, with a surface treatment agent of amine series; and a plating step for plating the copper column member, which has been surface-treated in the surface treatment step, with plating solution of methanesulfonic acid series.

The copper structure of the copper column 30 is plastically deformed in the wiredrawing step, the cutting step and the pressing step so that the copper column 30 is work-hardened. However, the work-hardened copper column 30 has better flexibility because the copper structure of the copper column 30 is recrystallized in the annealing step and crystal grains are grown up. Thus, the Vickers hardness of the copper column 30 becomes 55 HV or less.

Thus, according to the above-described method for manufacturing the copper column, the Vickers hardness of the copper column becomes 55 HV or less, and the copper column can be softened. Therefore, when the ceramic substrate 40 and the glass epoxy substrate 50 are joined by means of the copper column 30, the copper column 30 can absorb the heat stress caused by the difference between the thermal expansion of the ceramic substrate 40 and the thermal expansion of the glass epoxy substrate 50. As a result, the joint between the ceramic substrate 40 and the copper column 30 and the joint between the glass epoxy substrate 50 and the copper column 30 can be prevented from being cracked or destroyed.

In addition, since the copper column member annealed in the annealing step is surface-treated with the surface treatment agent of amine series, the surface of the copper column member becomes coarse so that plating solution facilitates the adhesion thereto. Moreover, since the copper column member surface-treated in the surface treatment step is plated with the plating solution of methanesulfonic acid series, the copper column can be rustproofed.

A method for manufacturing a copper column as one example of embodiments according to the present invention will be explained by reference to the attached drawings.
[Manufacturing Example of Copper Column 30]
<Wiredrawing Step, Cutting Step and Pressing Step>

First, the wiredrawing step, cutting step and pressing step of the method for manufacturing the copper column 30 will be described. It is assumed that the copper wire 10 in the embodiment of the present invention is previously drawn in the wiredrawing step. The wiredrawing means a process of drawing the copper wire to a predetermined diameter by striking the side surface of the copper wire and applying it to a die.

Figure 2A:
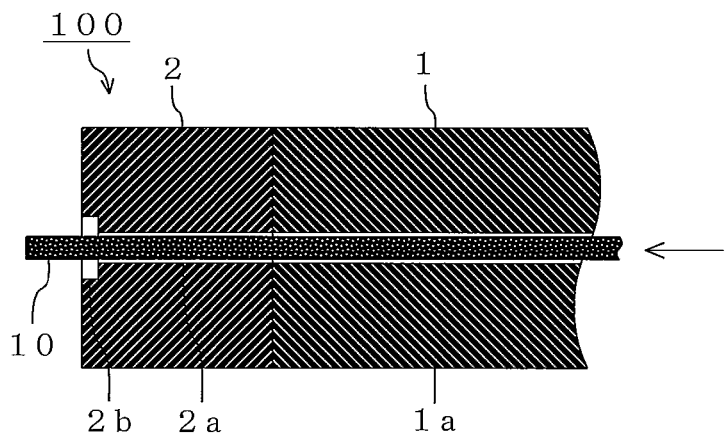
FIG. 2A is a cross sectional view for showing a manufacturing example (Part One) of the copper column member.

As shown in FIG. 2A, a manufacturing apparatus 100 is composed of a copper wire guide section 1 and a copper wire cutting section 2. A copper wire supplying section, not shown, is coupled with the copper wire guide section 1. For example, the copper wire supplying section supplies the copper wire 10 to the copper wire guide section 1 by, for example, rotating a spool on which the copper wire 10 is wined multiply (for example, the copper wire 10 is supplied along a direction of a leftward arrow in FIG. 2A).

The copper wire guide section 1 is provided with a guide path 1a having a diameter slightly larger than the diameter of the copper wire 10. The copper wire guide section 1 slides the copper wire 10 supplied by rotating the spool of the copper wire supplying section along the guide path 1a to lead it to the copper wire cutting section 2.

The copper wire cutting section 2 is provided adjacently to the copper guide section 1. The copper wire cutting section 2 includes a guide path 2a and a column head forming section 2b. The guide path 2a has a diameter that is slightly larger than the diameter of the copper wire 10, which is similar to the guide path 1a. In other words, the guide path 2a has the same diameter as that of the guide path 1a. The column head forming section 2b has a shape almost similar to a column head section 30b in order to form the column head section 30b that will be described hereinafter in FIGS. 5A and 5B.

The copper wire cutting section 2 slides the copper wire 10, which has been guided by the copper wire guide section 1, along the guide path 2a for guiding it to the column head forming section 2b by further rotating the spool of the copper wire supplying section. Thus, the end of the copper wire 10 is projected from the column head forming section 2b by a predetermined length.

Figure 2B:
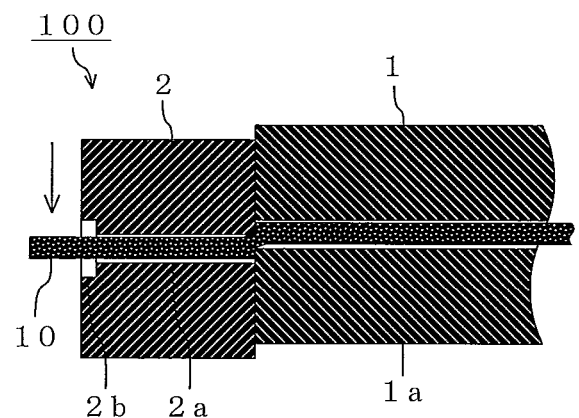
FIG. 2B is a cross sectional view for showing a manufacturing example (Part Two) of the copper column member.

As shown in FIG. 2B, the copper wire cutting section 2 moves at right angles to a carrying direction of the copper wire 10 by about half of the diameter of the copper wire 10 (in FIG. 2B, it moves in a direction of a downward arrow). This movement prevents a burr from occurring at the cut portion of the copper wire at a time of cutting the copper wire in FIG. 2C that will be discussed hereinafter. A stress at rupture is previously applied by a half diameter of the copper wirer at right angles (downward) to an axis of the copper wire.

Figure 2C:
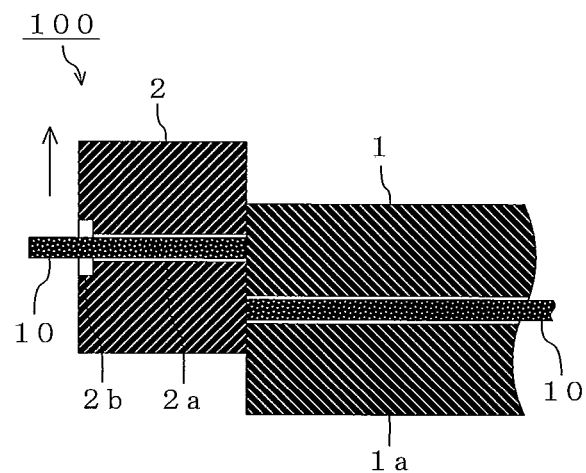
FIG. 2C is a cross sectional view for showing a manufacturing example (Part Three) of the copper column member.

As shown in FIG. 2C, the copper wire cutting section 2 moves by a predetermined distance in a direction of 180-degree opposite to the above mentioned moving direction of the copper wire 10 that has moved by about half diameter (in FIG. 2C, moves in a direction of an upward arrow). Then, the copper wire 10 is cut (sheared).

Figure 3A:
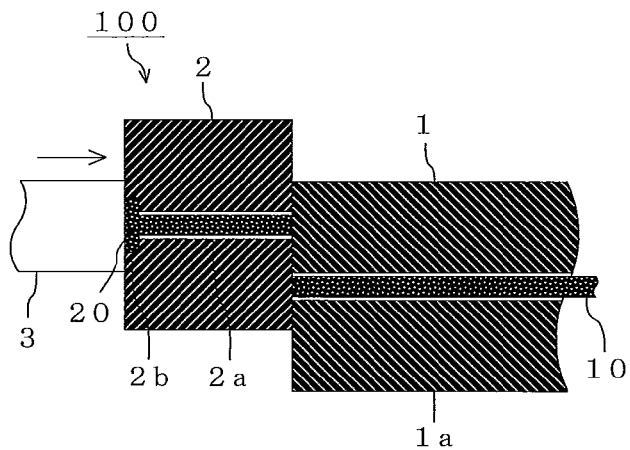
FIG. 3A is a cross sectional view for showing a manufacturing example (Part Four) of the copper column member.

As shown in FIG. 3A, a hammer 3 moves toward the column head forming section 2b (moves along a direction of a rightward arrow in FIG. 3A). Then, the hammer 3 strikes one end of the copper wire 10 that is projected from the column forming section 2b by the predetermined length. The struck copper wire 10 is molded to a shape of the column head section 20b by the column head forming section 2b (so-called press working) and thereby a nail-shaped copper column member 20 is completed.

Figure 3B:
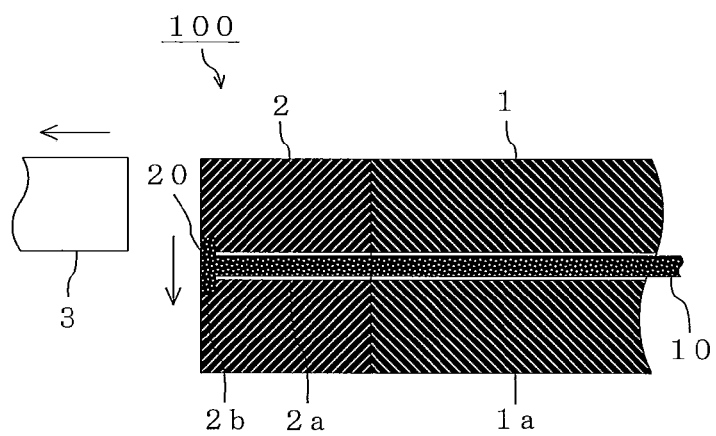
FIG. 3B is a cross sectional view for showing a manufacturing example (Part Five) of the copper column member.

As shown in FIG. 3B, the hammer 3 removes away from the column head forming section 2b (moves along a direction of a leftward arrow in FIG. 3B). Then, the copper wire cutting section 2 returns to a waiting position before cutting the copper wire 10 (moves along a direction of a downward arrow in FIG. 3B).

Figure 3C:
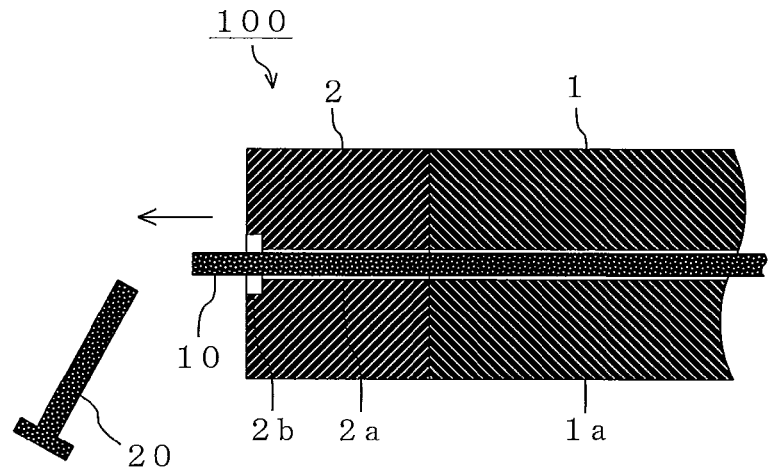
FIG. 3C is a cross sectional view for showing a manufacturing example (Part Six) of the copper column member.

As shown in FIG. 3C, by rotating the spool of the copper wire supplying section, the copper column member 20 waited at the guide path 2a and the column head forming section 2b is pushed by the copper wire 10. Then, the copper column member 20 is ejected from the copper wire cutting section 2. The ejected copper column member 20 is collected in a tray and the like, not shown.

In the copper column member 20 thus manufactured, the copper structure of the copper column member 20 is plastically deformed in the wiredrawing step and the cutting step so that the copper column member 20 is workharden. The Vickers hardness of this copper column member 20 is 110 through 120 HV.

<Annealing Step>

Figure 4:
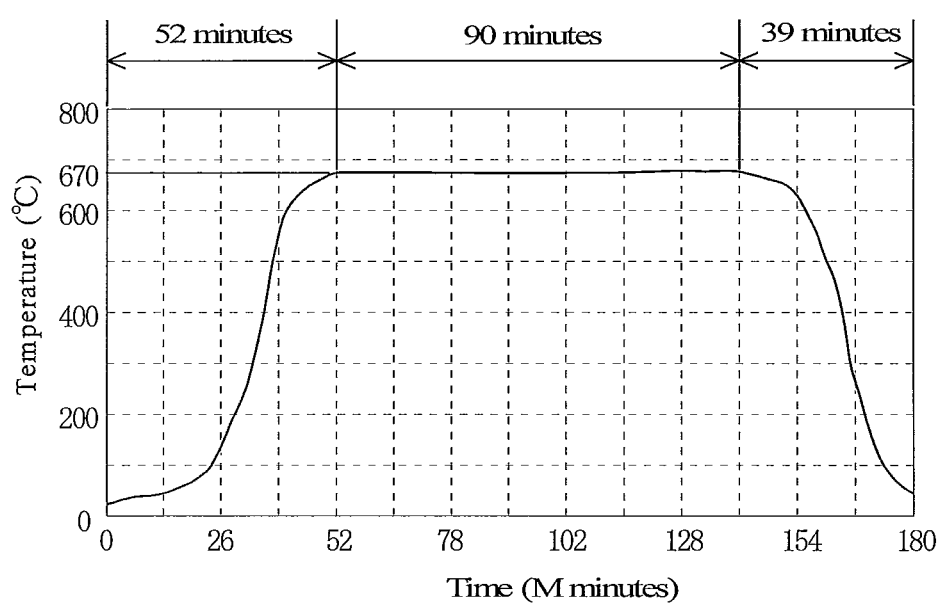
FIG. 4 is a diagram for explaining a temperature profile example of an annealing step.

Then, the annealing step in the manufacturing method of the copper column 30 will be discussed. The copper column member 20 manufactured by the manufacturing apparatus 100 for the copper column member is put in an annealing furnace and is annealed in accordance with a temperature profile shown in FIG. 4. In FIG. 4, a vertical axis represents a temperature (° C.) in the annealing furnace and a horizontal axis represents an elapsed time (minutes) after the copper column member 20 is put in the annealing furnace.

As shown in FIG. 4, the temperature profile of the copper column member 20 is composed of a heat-up period of 52 minutes from an ambient temperature to 670° C., a holding period of 90 minutes at 670° C. and a cooling-down period of 39 minutes from 670° C. to the ambient temperature. The annealed copper column member 20 improves its flexibility because the copper structure of the copper column member 20 is recrystallized and crystal grains are grown up. Thus, the Vickers hardness of the copper column member 20 becomes 55 HV or less.

<Surface Treatment Step and Plating Step>

Then, the surface treatment step and the plating step in the manufacturing method of the copper column 30 will be described. The surface of the copper column member 20 annealed as discussed hereinbefore is treated with a surface treatment agent of amine series. The surface of the copper column member 20 becomes coarse so that plating solution facilitates the adhesion thereto.

The copper column member 20 surface-treated with the surface treatment agent of amine series is plated with plating solution of methanesulfonic acid series. Thereby, the copper column 30 is completed wherein the surface of the copper column member 20 is covered with Sn. The copper column 30 is rustproofed by the Sn plating film. Since the surface is Sn, a wettability of a solder is improved and the joint between the ceramic substrate 40 and the glass epoxy substrate 50 becomes stronger.

Since the plating thickness of the copper column 30 is thin such as about 0.5 μm, there is nothing affecting the Vickers hardness of the copper column 30 and the Vickers hardness of the copper column 30 is kept to be 55 HV or less. If the Sn plating thickness is less than about 0.3 μm, an antirust effect deteriorates. If such thickness is larger than 1 μm, the Vickers hardness becomes 55 HV or higher and the cracks, etc. occur at the copper column. Therefore, 0.3-1 μm is desirable for the Sn plating thickness and about 05 μm is more desirable.

<Shape Example of Copper Column 30>

Figure 5A:
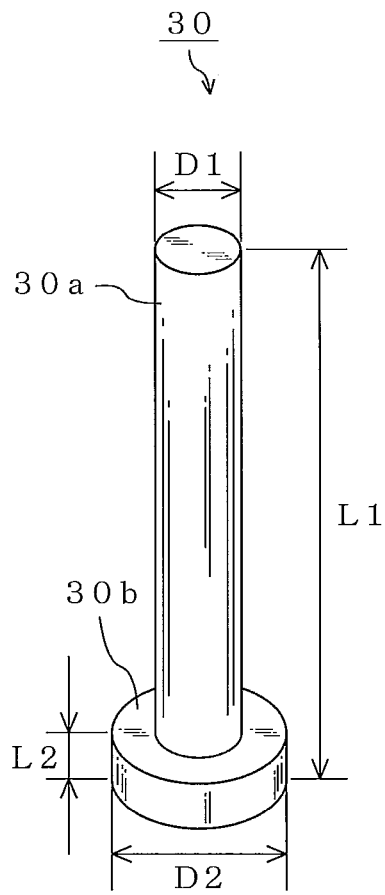
FIG. 5A is a perspective view of the copper column for showing a shape example thereof.
Figure 5B:
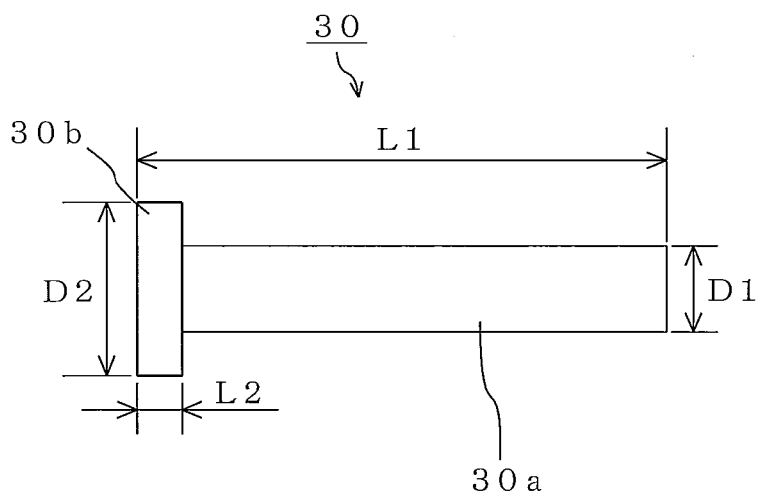
FIG. 5B is a front view of the copper column for showing the shape example thereof.

Then, a shape example of the copper column 30 manufactured by the above-discussed manufacturing method of the copper column 30 will be described. As shown in FIGS. 5A and 5B, the copper column 30 is composed of a column body section 30a and a column head section 30b. In this embodiment, a length L1 of the copper column 30 is 1.524 mm, a diameter D1 of the column body section 30a is 0.25 mm, a length L2 of the column head section 30b is 0.13 mm and a diameter D2 of the column head section 30b is 0.5 mm. In the copper column 30, since the diameter D1 of the column body section 30a is small, such as 0.25 mm, the column head section 30b having a flat end surface is provided to increase the soldering strength of the ceramic substrate 40 discussed in FIGS. 1A and 1B.

Thus, according to the copper column 30 manufactured by the copper column manufacturing method of this embodiment, since the Vickers hardness is 55 HV or less, the heat stress caused by a difference between the thermal expansion of the ceramic substrate 40 and the thermal expansion of the glass epoxy substrate 50 can be absorbed when the ceramic substrate 40 is joined to the glass epoxy substrate 50 through the copper column 30. As a result, the joint between the ceramic substrate 40 and the copper column 30 and the joint between the glass epoxy substrate 50 and the copper column 30 can be prevented from the destruction of the joining, such as the crack and fracture.

It is to be noted that although the copper column member 20 is annealed by maintaining a temperature at 670° C. for a period of 90 minutes in the annealing step of the embodiment, the invention is not limited thereto: The temperature of the copper column member 20 may be kept at 600° C. or higher for a period of 60 minutes or longer.

Although the column head section 30b is formed by the pressing step in the embodiment, the invention is not limited thereto: The copper column may be a straight cylinder shape without the column head section 30b.

Although the copper column 30 is manufactured by means of the cutting step and the pressing step in this order according to the embodiment, the invention is not limited thereto: The cutting step may be carried out after the pressing step.

Executed Example 1

A concrete manufacturing method of the copper column according to this invention, the copper column manufactured by this method, and the copper structure and crystal grains of the copper column before the annealing step in this executed example will be discussed.

The copper column of the present invention was manufactured by the following processes (1) through (7).

(1) The linearly-shaped copper wire consisting of oxygen-free copper and having a diameter of 6 mm was struck at its side surface and was passed through a die for wiredrawing it to a diameter of 2.6 mm.

(2) The wiredrawn copper wire having the diameter of 2.6 mm was further struck at its side surface and was passed through the die for wiredrawing it to a diameter of 0.25 mm.

(3) As shown in FIGS. 2A, 2B, 2C, 3A, 3B and 3C, the copper wire, which had been wiredrawn to the diameter of 0.25 mm, was cut into a length of 1.941 mm, one end of the cut copper wire was pressed by a hammer in order to form a column head section. The copper column member was manufactured. A length of this copper column member was 1.524 mm.

(4) The copper column member thus manufactured was put in a SUS vat and was annealed by passing it through a continuous conveyor type electrical resistance heating furnace (annealing furnace). The annealing conditions were that a conveyor speed was 30 mm/minute, a heating-up period up to 670° C. was 52 minutes, a holding period at 670° C. was 90 minutes, and a cooling-down period by a cooling fan was 39 minutes. The annealing furnace was filled with nitrogen gas for antioxidant of the copper column.

(5) After the annealed copper column member was washed with IPA (isopropyl alcohol), the surface of the copper column member was treated with the surface treatment agent of amine series.

(6) The annealed copper column member was put in the plating solution of methanesulfonic acid series and was Sn-plated by setting a time to make the plating thickness of about 0.5 μm.

(7) After the plating step, the copper column member was washed with IPA and dried.

Figure 6:
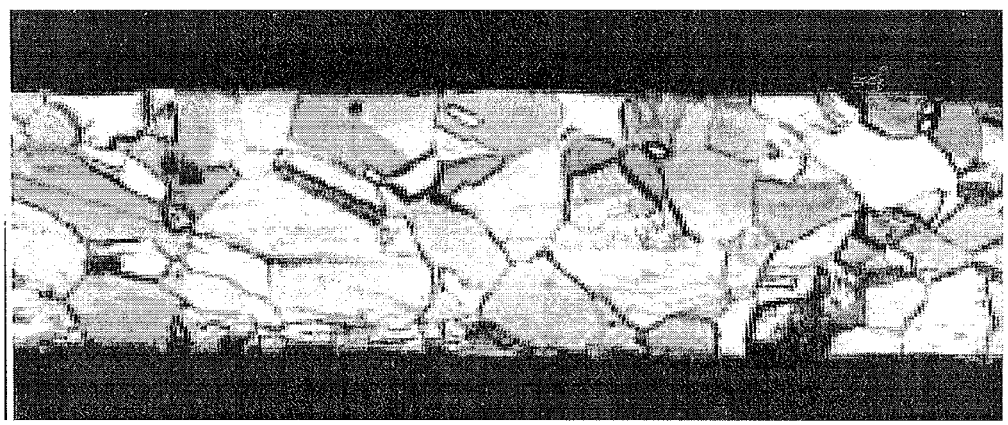
FIG. 6 is a magnified photograph for showing a structure example of the copper column after the annealing step.
Figure 7:
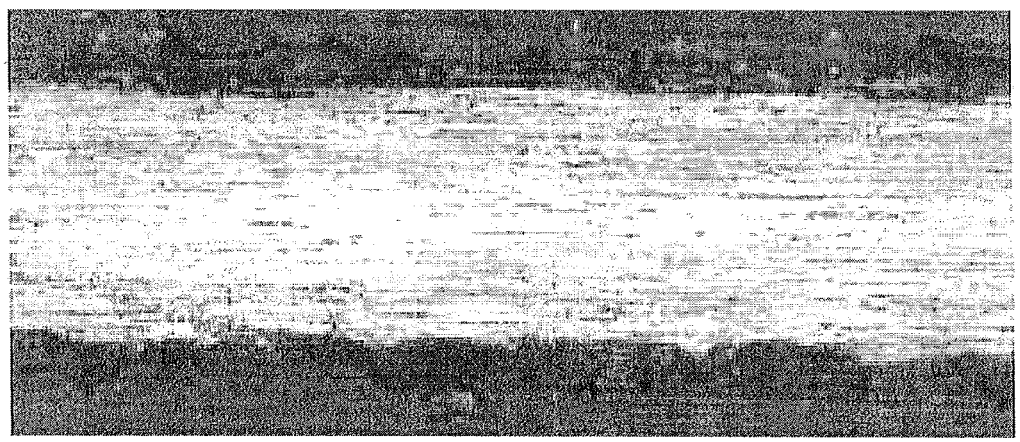
FIG. 7 is a magnified photograph for showing the structure example of the copper column before the annealing step.

FIG. 6 is a magnified photograph for showing a structure example of the copper column after the annealing, and FIG. 7 is a magnified photograph for showing a structure example of the copper column before the annealing. The structure of the copper column after annealing shown in FIG. 6 is much larger than the structure of the copper column before the annealing shown in FIG. 7. The copper composition of the copper column before the annealing is plastically deformed in the wiredrawing step, the cutting step and the pressing step. On the other hand, in the annealed copper column, the copper structure is recrystallized and the crystal grains are grown up.

In the crystal dimensions of the copper column after the annealing, an average grain diameter was 0.05 mm and an average Vickers hardness was 45.4 HV. In the crystal dimensions of the copper column before the annealing, the structure was plastically deformed and a grain diameter could not be measured; however, an average Vickers hardness was 113.1 HV. Thus, it was found that the copper column after the annealing was much softer than the copper column before the annealing. In fact, the crystal dimensions of the copper column were measured with a digital microscope. The Vickers hardness of the copper column was measured in accordance with "Vickers Hardness Test—Test Method, JIS Z2144".

Executed Example 2

In this executed example, a thermal cycle test result of the copper column according to the present invention (hereinafter referred to as "copper column of this executed example") and a pin manufactured by the manufacturing method discussed in Patent Document 2 (hereinafter referred to as "pin of the comparison example") will be described.

A CGA was formed by connecting 961 copper columns of this executed example to the ceramic substrate through solder paste. This CGA was mounted on the glass epoxy substrate through the solder paste (hereinafter referred to as "CGA of this executed example"). Similarly, 961 pins of the comparison example were connected to the ceramic substrate through the solder paste to form a CGA and the formed CGA was mounted on the glass epoxy substrate through the solder paste (hereinafter referred to "CGA of the comparison example").

By putting the CGA of this executed example and the CGA of the comparison example in a heat cycle tank under a temperature condition of −30 through 130° C. and a holding period of 10 minutes, the number of cycles was determined until the copper columns of the mounted devices were cracked in accordance with "Temperature Change Test Method JIS C0025". The results are shown in Table 1.

TABLE 1

| sample | manufacturing method | Vickers hardness | after 200 cycles | after 500 cycles | after 1,000 cycles |
|---|---|---|---|---|---|
| CGA of Executed Example | annealing of 670° C. × 90 minutes | 48 HV | no crack | no crack | no crack |
| CGA of Comparison Example | annealing of 670° C. × 5 minutes | 125 HV | cracked | destruction | destruction |

Figure 8A:
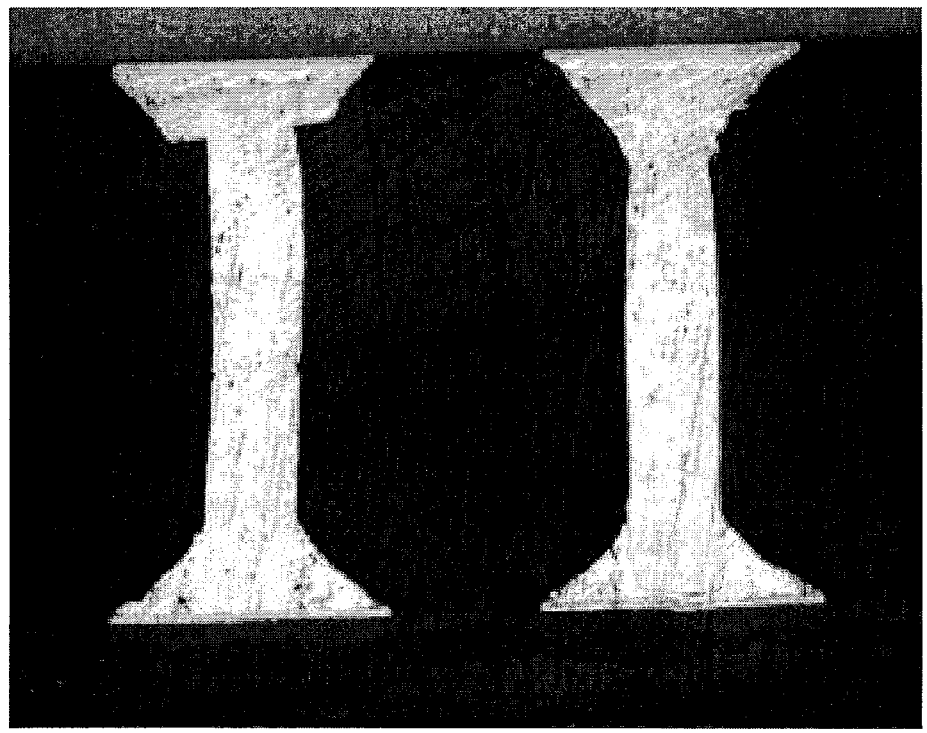
FIG. 8A is a photograph of a cross section of the copper column for showing a connection example thereof after a heat cyclic test (1,000 cycles).
Figure 8B:
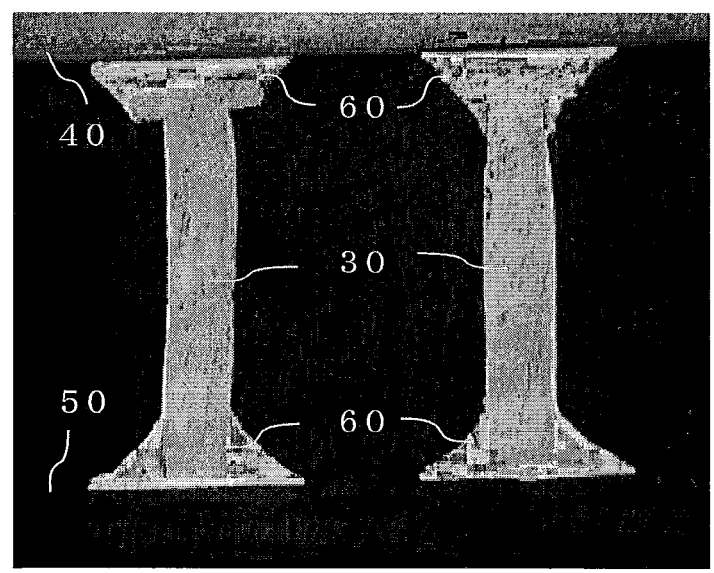
FIG. 8B is a drawing wherein reference numbers are attached to the copper column shown in the photograph of FIG. 8A.

Since the Vickers hardness of the copper column of this executed example was 48 HV and the Vickers hardness of the pin of the comparison example was 125 HV, the Vickers hardness of the copper column of this executed example was a half of that of the pin of the comparison example or less. In the CGA of this executed example, the joint between the ceramic substrate and the copper column and the joint between the glass epoxy substrate and the copper column were not cracked under condition of 1,000 cycles in the thermal cycle test (see FIGS. 8A and 8B). On the other hand, in the CGA of the comparison example, the joint between the glass epoxy substrate and the pin was cracked after 200 cycles and was destructed after 500 cycles.

The Vickers hardness and the heat cycle characteristics of the executed example are accomplished by maintaining the annealing period for the copper column longer. Therefore, the copper column according to the present invention can be applied to the CGA.

EXPLANATION OF REFERENCE NUMBERS

1: copper wire guide section
1a, 2a: guide path
2: copper wire cutting section
2b: column head forming section
3: hammer
10: copper wire
20: copper column member
30: copper column
30a: column body section
30b: column head section
40: ceramic substrate
50: glass epoxy substrate
60: solder fillet

The invention claimed is:

1. A copper column characterized in that the copper column forms a ceramic column grid array and joins a ceramic substrate and a glass epoxy substrate, the copper column being made by a wiredrawing step for drawing a copper wire to a predetermined diameter, a cutting step for cutting the copper wire, which has been drawn in the wiredrawing step, into a predetermined length, and an annealing step for annealing the copper wire, which has been cut in the cutting step, as a copper column body section by maintaining the copper wire at 600° C. or higher in a heating temperature for a period of 60 minutes or longer, the copper column having the Vickers hardness of 55 HV or less and the copper column body section having a column head section with a flat end surface at one end thereof.

2. A copper column as recited in claim 1 characterized in that the column head section has a diameter that is larger than a diameter of the copper column body section.

3. A copper column as recited in claim 1 characterized in that the copper wire annealed in the annealing step is surface-treated with a surface treatment agent of amine series.

4. A copper column as recited in claim 1 characterized in that the annealed copper wire or the surface-treated copper wire is plated with plating solution of methanesulfonic acid series.

* * * * *